United States Patent [19]

Martin et al.

[11] Patent Number: 5,736,607

[45] Date of Patent: Apr. 7, 1998

[54] HERMETICALLY SEALED DIES AND DIE ATTACH MATERIALS

[75] Inventors: John R. Martin, Foxborough; Peter W. Farrell, Acton, both of Mass.

[73] Assignee: Analog Devices, Inc., Norwood, Mass.

[21] Appl. No.: 464,320

[22] Filed: Jun. 5, 1995

[51] Int. Cl.$^6$ .............................. H01L 21/60; C08L 81/00
[52] U.S. Cl. .............................................. 524/609; 437/209
[58] Field of Search ................................ 524/609; 437/209

[56] References Cited

U.S. PATENT DOCUMENTS

| | | | |
|---|---|---|---|
| 4,945,154 | 7/1990 | Ghali et al. | 524/323 |
| 5,037,902 | 8/1991 | Harris et al. | 525/436 |
| 5,244,707 | 9/1993 | Shores | 428/76 |
| 5,389,433 | 2/1995 | Chang et al. | 428/310.5 |

OTHER PUBLICATIONS

Technical Service Information Note, "'Victrex' Polyethersulphone," Performance Plactics Group, ICI Plastics Division (1978).

"RADEL Resins Engineering Data," Amoco Performance Products, Inc., pp. i, 1–5, 19, & 25 (no date).

Fried, "Polymer Technology–Part 7: Engineering Thermoplastics and Specialty Plastics," Plastics Engineering (1983).

*Primary Examiner*—Randy Gulakowski
*Attorney, Agent, or Firm*—Hale and Dorr LLP

[57] ABSTRACT

A semiconductor die is packaged in a hermetically sealed ceramic dual in-line package (cerdip) with a non-standard polysulfone film, or with a paste made from the film, as a die attach material. A cerdip process heats to temperatures of at least about 380° C. The paste is produced by dissolving the film with NMP or with a blend including NMP, and adding a thixotropic agent. The paste or film forms a bond in a cerdip with less than 5000 ppm moisture without using a getter.

14 Claims, 3 Drawing Sheets

HERMETICALLY SEALED DIES AND DIE ATTACH MATERIALS

FIELD OF THE INVENTION

This invention relates to a hermetic package for sealing a die and to attachment of a die to a sealed package.

BACKGROUND OF THE INVENTION

A die can be hermetically sealed in a ceramic dual in-line package (cerdip) for protection. In one process for sealing in a cerdip, a die is placed on a silver paste adhesive in an open-topped box. A layer of glass is formed along the top of the box and a second layer of glass is provided along the lid, corresponding to the layer of glass on the box. After conductive leads are placed across the layer of glass on the box and coupled to the die, the lid is placed on the box. The layers of glass are then melted at a temperature of at least 380° C., causing the glass layers to fuse together and seal the box.

One problem with this typical process is that the silver paste adhesive can become mechanically stressed and form cracks to relieve the stress. These cracks can appear along the chip in different places, thus causing inconsistencies in manufacturing and in service.

Lower temperatures, about 330° C., are currently used to hermetically seal dies in side braze packages. This type of package, which has multiple layers of ceramic and conductors, is expensive and adds significant costs to manufacturing. To attach a die in a side braze package, organic materials, such as a standard polysulfone, have been used as an adhesive because organic materials create less stress. These organic materials cannot be used at the higher temperatures employed in typical cerdip processes (380° to 440° C.) because they thermally degrade and give off water and other organic by-products, such as partially oxidized organic material. A getter can be used to attract moisture, but it does not solve the other problems of degradation.

SUMMARY OF THE INVENTION

The present invention includes a die attach paste that is based on a non-standard polysulfone, the manufacture of such a paste, and its use as a die attach material in a cerdip process. The present invention also includes the use of a non-standard polysulfone film as a die attach material, either at the wafer stage or the individual die stage, and for use in a commercial cerdip process. The present invention improves packaging by providing a die attach material that works at temperatures used in a cerdip process, i.e., 380° C., while overcoming certain drawbacks of other die attach materials, such as cracking, giving off moisture, and other degrading. The moisture is reduced without using a separate getter.

In one aspect, the present invention is a non-standard polysulfone adhesive paste, a method for making the paste, and a method for using the paste in a cerdip process. Non-standard polysulfones, such as polyethersulfone, polyarylsulfone, and polyphenylsulfone, are distinguished here from what has generally become known as "standard" polysulfone, i.e., a polysulfone that has isopropylidene as an R-group material. The non-standard polysulfones can have other R-group materials, such as ether in polyethylsulfone, or no R-group in polyphenylsulfone. Non-standard polysulfones preferably have a glass transition temperature over 200° C. and hold up under a cerdip process so that they produce less than 5000 ppm of moisture in a cerdip package without using a getter.

To make a paste, a non-standard polysulfone film is dissolved in a solvent, preferably N-methyl 2-pyrrolidone (NMP) or a blend including NMP. A thixotropic agent, such as fused silica, is added to the solution to reduce tailing. This paste can be used as a die attach at temperatures greater than 350° C. and even at temperatures over 380° C. The viscosity of the paste allows it to be used with conventional packaging equipment.

In another aspect, a non-standard polysulfone film is used as a die attach material in a cerdip process. The film can be applied to a wafer of dies or to the dies individually. If applied to an individual die, the film can be cut to a desired shape to improve the bond and to reduce stress.

As an organic material, an adhesive with non-standard polysulfone transmits from a cerdip to a silicon die less stress than silver paste transmits. Stresses generated within the non-standard polysulfones are also lower, and therefore have only minor effects on device performance. These films have attractive yield and performance characteristics compared to silver paste when used, for example, to hermetically package an accelerometer. The die attach materials of the present invention can be used with any type of die, and have been found to work well in packaging accelerometers that have micromachined structures.

DETAILED DESCRIPTION

The present invention relates to the use of a non-standard thermoplastic polysulfone film and to a paste made from such a film as die attach materials. These die attach materials are preferably used in hermetically sealed packages, such as cerdips.

Figure 1A:
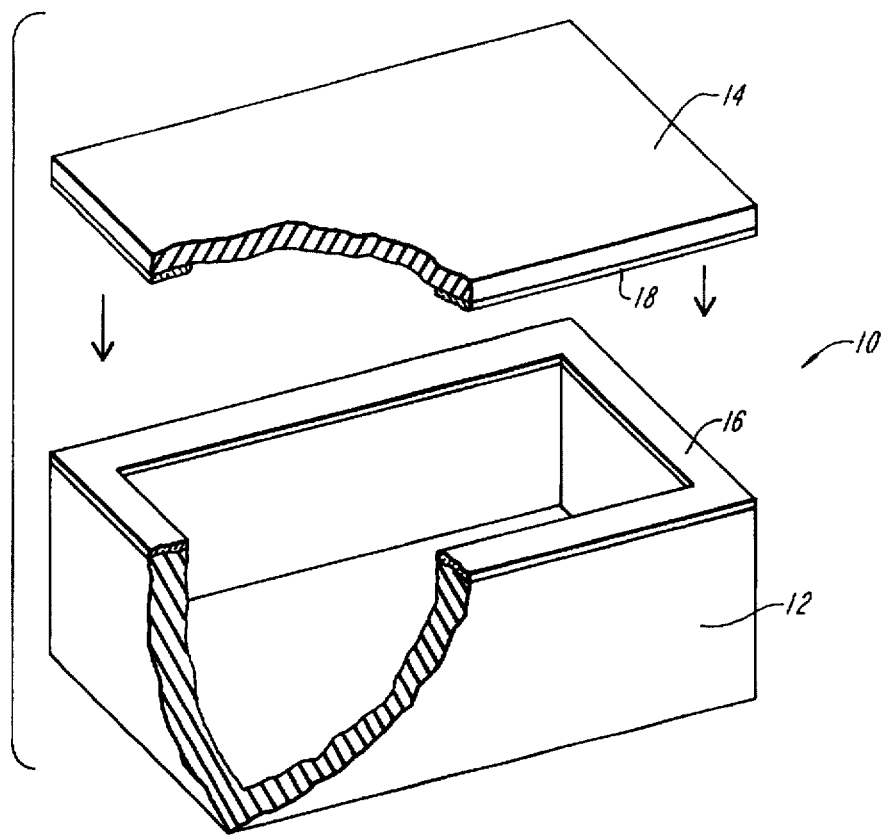
FIGS. 1(a)–1(d) are perspective views of a cerdip illustrating steps performed when packaging a die.

Referring to FIG. 1(a), a cerdip 10 is initially provided as an open-topped ceramic box 12 and a separate lid 14. The box and the lid have respective sealing areas where they meet when the lid is put on the box. Each of the sealing areas is coated with a glass layer 16, 18, such as Kyocera KC-380 glass.

Figure 1B:
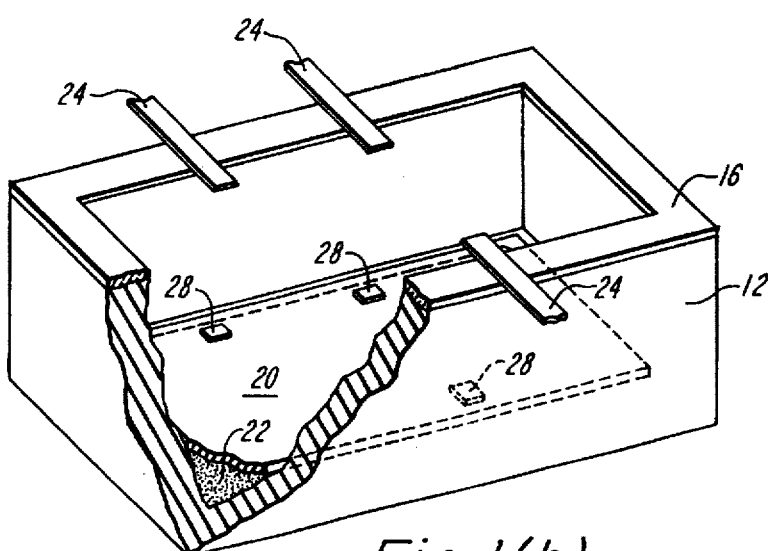
Figure 1C:
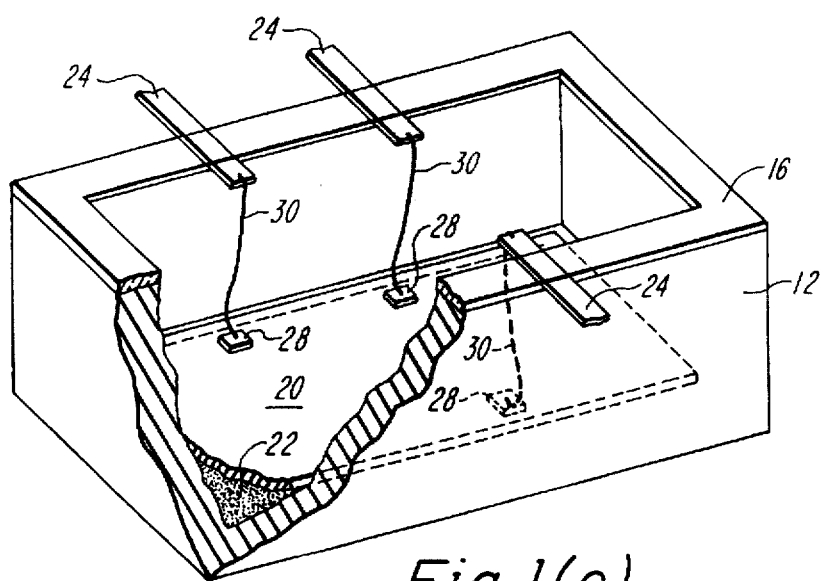
Figure 1D:
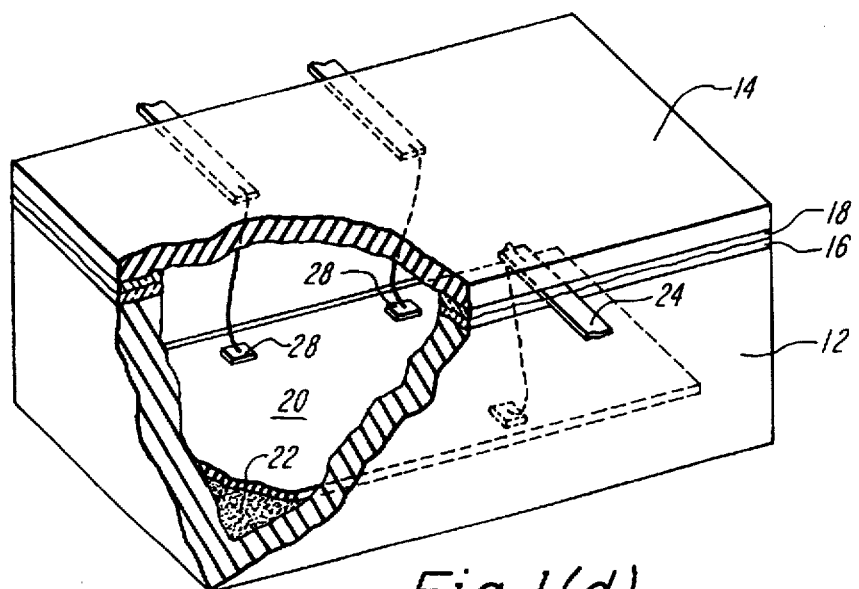

Referring to FIGS. 1(b)–1(d), to package a die 20, an adhesive die attach layer 22 is provided between the bottom of box 12 and die 20. This adhesive die attach layer, which includes a non-standard polysulfone, can be provided as a film or as a paste. Wire leads 24 are positioned across glass layer 16 at the sealing area of the box. Die 20, box 12, and leads 24 are heated together to about 380° C.–430° C. (depending on the type of glass). The heat melts the glass so that wire leads 24 become embedded in the glass layer 16. If a non-standard polysulfone paste is used, the heat simultaneously drives off solvents in the paste. Alternatively, wire leads 24 can be embedded in a separate step before mounting the die in the package.

After the die cools, contact pads 28 on the die are coupled to the wire leads with wire bonds 30 (FIG. 1(c)). The lid 14 is put on the box, and cerdip 10 and die 20 are again heated so that glass layers 16, 18 fuse together to hermetically seal the die in the cerdip (FIG. 1(d)). This process is generally similar to prior known processes, except that such prior processes use silver paste, which, as noted above, microcracks in unpredictable and inconsistent ways. Microcracking causes changes in the mechanical stress fields, a performance problem in stress-sensitive dies.

The non-standard polysulfones, such as polyethersulfone, polyarylsulfone, and polyphenylsulfone, are distinguished here from what has generally become known as "standard" polysulfone (note that the term "polyarylsulfone" may be used so that it includes polyethersulfone).

Standard and non-standard polysulfones can have the following structure:

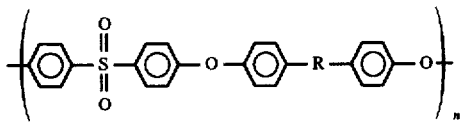

In a standard polysulfone, such as Udel (a tradename of Amoco Performance Products, Inc.) or Staystik (a tradename of Alpha Metals), the R-group is isopropylidene. In polyethersulfone, the R-group is ether, and in polyphenylsulfone, there is no R-group. Polyethersulfone and polyphenylsulfone are commercially available as films under the names "Radel A" and "Radel R" (tradenames of Amoco Performance Products, Inc.), respectively. These materials have been used for trays in the medical field because of easy sterilization, and in the aerospace field for interior panels, because of good non-burn characteristics, impact resistance, and moldability.

Udel polysulfone has a glass transition temperature ($T_g$) of 190° C., while Radel A and Radel R each have a $T_g$ of 220° C. (the $T_g$ of a material is the temperature at which a material goes from a glassy to a rubbery phase). Thermogravimetric analysis (TGA) also shows that Udel loses more weight at lower temperatures than Radel A and Radel R do. As used here, a "non-standard polysulfone" preferably has a glass transition temperature over 200° C., and, when sealed in a cerdip process at least about 350° C., preferably 380° C. or more, produces less than about 5000 ppm moisture without a getter. However, a polysulfone with a $T_g$ less than 200° C. would still be a usable non-standard polysulfone if it produces a low level of moisture without a getter and provides good bonding when processed in a cerdip with temperatures exceeding about 350° C.

Figure 2:
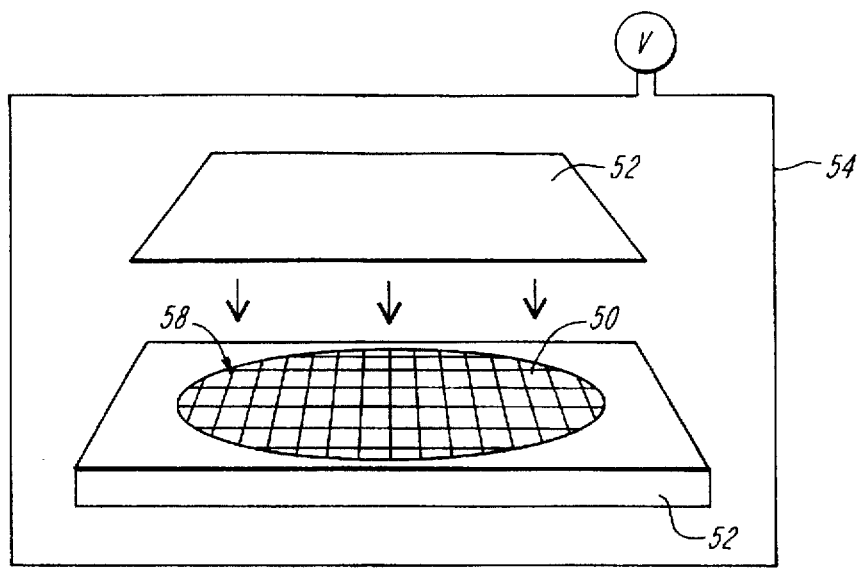
FIG. 2 is a schematic diagram illustrating a process for bonding a film to a wafer.

Non-standard polysulfone film can be applied at the wafer level or to dies individually. In one embodiment, a film piece 52 is cut from sheets about 100 microns (4 mils) thick and is applied to a back side of a wafer of dies. Referring to FIG. 2, a wafer 50 is placed upside down on a heated stage 51 inside a vacuum forming fixture 54. Applying the vacuum causes the film piece 52 to be drawn onto the back side 58 of hot wafer 50, thus forming a hot melt bond between the film piece and the wafer. This bond should be substantially free of voids and strong enough to withstand wafer sawing. After the wafer is sawed into individual dies, each of the dies is packaged using a hot melt or sonic process. If a sonic process is used with dies that have surface micromachined structures, such as accelerometers, care must be taken to avoid harmful mechanical resonances. To achieve adequate bond strength, the film-substrate interface must be raised to a temperature above the film's $T_g$ before wafer sawing.

Figure 3:
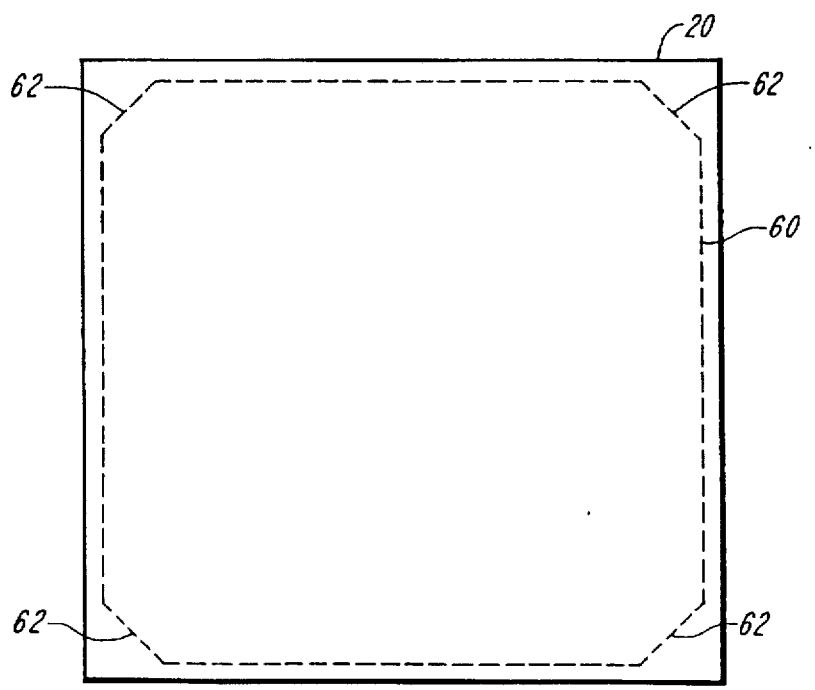
FIG. 3 is a plan view of a die and die attach film shown together.

In another embodiment that uses film as a die attach, small pieces of the film are provided for each die individually in each package. Referring to FIG. 3, film piece 60 is preferably cut to a shape and size so that there is no bond at the corners of die 20, e.g., with a chamfer 62 at each corner. Providing a film piece with such a shape reduces stress, which is otherwise generally highest at corners of the die. The die is bonded with the film using a hot melt process. In this process, the package is heated above the film's $T_g$ (preferably over 200° C.), and the die is then placed on the molten piece of film in the package. The die is then scrubbed slightly to ensure wetting. After bonding, the assembly is cooled to room temperature. Because some flow can occur in the film piece when it is heated, this process requires carefully controlled placement of film piece 60 against die 20.

Table I (reproduced below) shows results of tests that were performed on standard and non-standard polysulfone films. In those tests, accelerometer dies were packaged in eight-lead cerdips with standard polysulfone film, including Udel P1700NT and Staystik 415, 611, and 501, and with Radel A-100 polyethersulfone film.

TABLE I

Comparison of RGA Levels of Cerdips Assembled with Polysulfone and Polyethylsulfone Films

| Tradename | Film Thick. (mils) | Number of Lots | Ave. RGA (ppm) |
| --- | --- | --- | --- |
| Udel P1700NT | 3 | 5 | 22,750 |
| Udel P1700NT | 5 | 1 | 38,520 |
| Staystik 415 | 3 | 4 | 15,960 |
| Staystik 611 | 3 | 4 | 40,600 |
| Staystik 501 | 3 | 3 | 15,230 |
| Radel A-100 | 4 | 5 (Seal 1)* | 2,340 |
| Radel A-100 | 4 | 7 (Seal 2) | 2,350 |

*Seal 1 and Seal 2 refer to slightly different lid seal processes. Similar seal processes were used with Staystik and Udel.

As indicated in Table I, using residual gas analysis (RGA), the lots with Udel and Staystik were found to have moisture levels that exceeded 10,000 ppm. These moisture levels are too high relative to the military standard (and the de facto industry standard) of 5000 ppm of moisture for a hermetic package. Using Radel A-100 polyethersulfone film, however, the average RGA levels were very acceptably below 2500 ppm of moisture.

While these films work well as die attach materials and have substantial advantages over both silver paste and standard polysulfone materials, films cannot generally be used with standard equipment for packaging dies in cerdips. To allow use with standard equipment, the film is converted into a paste having a viscosity such that it can be used with the equipment.

To produce the paste, the film is first dissolved, preferably by a solvent that can be handled safely. While these non-standard polysulfones are difficult to dissolve, it has been found that N-methyl 2-pyrrolidone (NMP), a commercially available solvent, meets the desired requirements. Specifically, the solvent must have low volatility—if it evaporates too quickly, the paste thickens and clogs the dispense nozzle tip when the equipment is stopped. The solvent must also be completely removed by a drying process; otherwise, residual solvents form moisture if they degrade during sealing or during the useful life of the device. The residual solvent should all be released, but not too gradually, because such gradual release can cause the mount to shrink, thus resulting in die stress.

To achieve adequate die attach thickness, the film should be soluble at relatively high concentrations. For example, if an application requires a die attach thickness of 25 microns (1 mil) and two-thirds of the die attach paste is solvent, a paste layer that is 75 microns (3 mils) must be dispensed to achieve the target thickness. Dissolving non-standard polysulfone film requires high temperature, e.g., 140° C. for 4 hours. NMP can be used alone as the solvent or in a blend with other solvents, such as dimethyl succinate.

Once dissolved, the solution is stable at room temperature. A thixotropic agent, such as a fumed silica, e.g., Cab-O-Sil TS-720 (a tradename of Cabot Corp.), is then added to help thicken the dissolved film and to reduce tailing in the paste when it is dispensed. The resulting paste has a consistency and a viscosity such that it can be used instead of silver paste with standard packaging equipment.

In one embodiment, the paste is squirted through a nozzle into a cerdip box as described above in connection with FIG. 1. In another embodiment, paste can be applied at the wafer level. To do this, wafer spinners apply the paste to the backside of a wafer. After the solution dries and the wafer is sawed, the devices are mounted in the package as described above.

Table II (reproduced below) shows the results of tests performed with pastes made from Radel A-100 and Radel A-300 (two different molecular weight grades).

TABLE II

RGA Levels of Cerdips Assembled with High Temperature Polysulfone Pastes

| Type | Vol. # Radel | Solvent | Dry Process # | Average RGA (ppm) |
|---|---|---|---|---|
| PES-1 | 33 | NMP | LFE | 2940 |
| PES-2 | 33 | NMP | LFE | 1550 |
| PES-1 | 28 | NMP/DBE | LFE | 2770 |
| PES-2 | 28 | NMP/DBE | LFE | 2370 |
| Empty | Package | None | LFE | 520 |
| PES-1 | 33 | NMP | 300° C./2 hrs. | 2530 |
| PES-2 | 33 | NMP | 300° C./2 hrs. | 4280 |
| PES-1 | 28 | NMP/DBE | 300° C./2 hrs. | 3040 |
| PES-2 | 28 | NMP/DBE | 300° C./2 hrs. | 3790 |
| Empty | Package | None | 300° C./2 hrs. | 540 |
| PES-1 | 33 | NMP | 325° C. BFB | 3600 |
| PES-2 | 33 | NMP | 325° C. BFB | 2850, 4330, 2050 |
| PES-1 | 28 | NMP/DBE | 325° C. BFB | 5000, 4730 |
| PES-2 | 28 | NMP/DBE | 325° C. BFB | 2780, 2900, 4460 |
| Empty | Package | None | 325° C. BFB | 570 |

Comparison: 9 lots of Staystik 101, 211 & 301 filled and unfilled PS pastes had moisture levels over 10,000 ppm.

*After a 90 minute predry at 150° C.
Key
PS Standard polysulfone
PES-1 Polyethersulfone (high viscosity, Radel A-100)
PES-2 Polyethersulfone (lower viscosity, Radel A-300)
NMP N-methyl 2-pyrrolidone
DBE Dimethyl succinate (dupont Dibasic Ester, DBE-4)
NMP/DBE NMP mixed with DBE in 2/1 ratio (by volume).
325° C. BFB Belt furnace bake; 325° C. peak temperature and 30 minutes above 280° C.
LFE Belt furnace leadframe embedding for Kyocera KC-380 seal glass.

As indicated in Table II, these tests show that all lots made with non-standard polysulfone paste had average RGA levels less than equal to 5000 ppm of moisture. The die shear strength was tested and found consistently to exceed 5000 grams (thus meeting the military standard for shear strength in a bond).

Both film and paste that include non-standard polysulfones meet the criteria for a die attach in hermetic packaging. Both film and paste bond well to device and package surfaces; meet impurity standards, i.e., low levels of moisture, volatiles, corrosives, and mobile ions; provide a low stiffness mount, i.e., have a combination of low modulus, high thickness, and consistent flatness; have a sufficiently low glass transition temperature; have a low thermal expansion coefficient; have thermal and mechanical stability; are suitable for high volume use in a process that gives a reproducible product; and can be used as a relatively thick die mount, a useful aspect because mechanical compliance increases with thickness.

Having described embodiments of the present invention, it should be apparent that other modifications can be made without departing from the scope of the invention as defined in the appended claims. For example, silver flake can be added as a filler and thixotropic agent to improve flow properties and to add electrical and thermal conductivity if desired.

What is claimed is:

1. A method comprising:
   dissolving a non-standard polysulfone material with a solvent;
   adding a thixotropic agent to produce a paste;
   providing the paste in a container; and
   positioning a die on the paste.

2. The method of claim 1, wherein the providing step includes providing the paste in a cerdip.

3. The method of claim 1, wherein the step of dissolving includes dissolving a material selected from a group consisting of polyethersulfone, polyarylsulfone, and polyphenylsulfone.

4. The method of claim 3, wherein the step of dissolving includes dissolving with a solvent including N-methyl 2-pyrrolidone (NMP).

5. The method of claim 3, wherein the providing step includes providing the paste in a cerdip to produce a die assembly.

6. The method of claim 5, further including a step of heating the die, the container, and the paste to at least about 380° C.

7. The method of claim 6, further including a step of hermetically sealing the die in the container, wherein the container contains less than 5000 ppm of moisture after sealing without using an added getter.

8. The method of claim 1, further including a step of heating the die, the container, and the paste to at least about 380° C.

9. The method of claim 8, further including a step of hermetically sealing the die in the container, wherein the container contains less than 5000 ppm of moisture after sealing without using an added getter.

10. A method comprising the steps of:
    dissolving a non-standard polysulfone material with a solvent;
    adding a thixotropic agent to produce a paste;
    providing the paste in an open container;
    positioning a die on the paste;
    providing a cover over the open container; and
    heating the open container, die, and paste to seal the container so that the container encloses the die.

11. The method of claim 10, wherein the step of providing the paste in an open container includes providing the paste in an open container that has a body that includes ceramic, and wherein the cover and open container have a material so that the heating step creates a hermetic seal.

12. A method including:
    providing in an open container a die attach material made from a non-standard polysulfone material dissolved with a solvent and to which a thixotropic agent has been added to produce a paste; and
    providing a semiconductor die on the die attach material.

13. The method of claim 12, further including providing a cover over the open container, and heating the open container, die, and paste to seal the container so that the container encloses the die.

14. The method of claim 13, wherein the step of providing the paste in an open container includes providing the paste in an open container that has a body that includes ceramic, and wherein the cover and open container have a material so that the heating step creates a hermetic seal.

* * * * *